US011598798B1

(12) United States Patent
Bucklew et al.

(10) Patent No.: US 11,598,798 B1
(45) Date of Patent: Mar. 7, 2023

(54) SENSOR RECEIVER HAVING RYDBERG CELL AND SPACED APART PULSED PROBE BEAMS AND ASSOCIATED METHODS

(71) Applicant: EAGLE TECHNOLOGY, LLC, Melbourne, FL (US)

(72) Inventors: Victor G. Bucklew, Richmond, VA (US); Jerrod Langston, West Melbourne, FL (US); James Drakes, Occoquan, VA (US); Samuel H. Knarr, Melbourne, FL (US)

(73) Assignee: EAGLE TECHNOLOGY, LLC, Melbourne, FL (US)

( * ) Notice: Subject to any disclaimer, the term of this patent is extended or adjusted under 35 U.S.C. 154(b) by 0 days.

(21) Appl. No.: 17/445,316

(22) Filed: Aug. 18, 2021

(51) Int. Cl.
*G01R 29/08* (2006.01)
(52) U.S. Cl.
CPC ................ *G01R 29/0885* (2013.01)
(58) Field of Classification Search
CPC .................................................. G01R 29/0885
USPC .......................................................... 324/96
See application file for complete search history.

(56) References Cited

U.S. PATENT DOCUMENTS

| | | | |
|---|---|---|---|
| 9,970,973 B2 | 5/2018 | Anderson et al. | |
| 10,509,065 B1* | 12/2019 | Shaffer | G01R 29/0885 |
| 10,605,840 B1* | 3/2020 | Amarloo | G01J 5/0875 |
| 10,823,775 B2 | 11/2020 | Anderson et al. | |
| 2011/0080580 A1* | 4/2011 | Fermann | G01N 21/65 |
| | | | 372/18 |
| 2019/0187198 A1* | 6/2019 | Anderson | G01R 29/0878 |
| 2020/0136727 A1 | 4/2020 | Graceffo et al. | |
| 2020/0233025 A1* | 7/2020 | Salim | G01R 29/0885 |
| 2020/0292606 A1* | 9/2020 | Holloway | G01R 29/0892 |
| 2020/0295838 A1 | 9/2020 | Gordon et al. | |
| 2021/0048465 A1 | 2/2021 | Anderson et al. | |

OTHER PUBLICATIONS

Anderson, David A., Rachel E. Sapiro, and Georg Raithel. "Rydberg atoms for radio-frequency communications and sensing: Atomic receivers for pulsed RF field and phase detection." IEEE Aerospace and Electronic Systems Magazine 35.4 (2020): 48-56. (Year: 2020).*
Abel, Richard. Coherent excitation of ultracold atoms between ground and Rydberg states. Diss. Durham University, 2011. (Year: 2011).*
Anderson, David A., Rachel E. Sapiro, and Georg Raithel. "Rydberg atoms for radio-frequency communications and sensing: Atomic receivers for pulsed RF field and phase detection." IEEE Aerospace and Electronic Systems Magazine 35.4 (2020): 48-56. (Year: 2020) (Year: 2020).*
Abel, Richard. Coherent excitation of ultracold atoms between ground and Rydberg states. Diss. Durham University, 2011. (Year: 2011) (Year: 2011).*

(Continued)

*Primary Examiner* — Christopher P McAndrew
(74) *Attorney, Agent, or Firm* — Allen, Dyer, Doppelt + Gilchrist, P.A.

(57) ABSTRACT

A sensor receiver includes a Rydberg cell configured to be exposed to a radio frequency (RF) signal, and a probe source configured to generate a plurality of spaced apart pulsed probe beams within the Rydberg cell. The pulsed probe beams are offset in time from one another. A detector is positioned downstream from the Rydberg cell.

22 Claims, 8 Drawing Sheets

(56) References Cited

OTHER PUBLICATIONS

David H Meyer et al., "Assessment of Rydberg Atoms for Wideband Electric Field Sensing," J. Phys. B: At. Mol. Opt. Phys. 53 034001, 2020, 16 pages.

Mohl, et al., "Photon correlation transients in a weakly blockaded Rydberg ensemble", Journal of Physics B: Atomic, Molecular and Optical Physics, Mar. 2020, pp. 1-7.

Sapiro et al., "Time dependence of Rydberg EIT in pulsed optical and RF fields", Journal of Physics B: Atomic, Molecular and Optical Physics, Mar. 2020, pp. 1-10.

Thaicharoen et al., "Electromagnetically-induced transparency, absorption, and microwave field sensing in a Rb vapor cell with a three-color all-infrared laser system", University of Michigan Department of Physics, Rydberg Technologies, Inc., May 2019, pp. 1-9.

\* cited by examiner

SENSOR RECEIVER HAVING RYDBERG CELL AND SPACED APART PULSED PROBE BEAMS AND ASSOCIATED METHODS

FIELD OF THE INVENTION

The present invention relates to Rydberg atom-based sensors, and, more particularly, to a sensor receiver that includes a Rydberg cell, a probe source and detector, and related methods.

BACKGROUND OF THE INVENTION

Radio frequency (RF) signals are generated and received in communications, sensing, and intelligence applications across a wide range of commercial markets and government divisions. Emerging RF applications are pushing requirements to higher frequency ranges with new waveforms that are difficult to detect and require RF receivers or sensors that have increased sensitivity. As RF channels become more heavily crowded, there is a desire to push to alternative RF bands spanning from 0 to 100 GHz and beyond. While some RF sensors span multiple bands, most are band-limited and can cover only a few tens of GHz, with a typical upper limit of about 40 GHz, e.g., Ka band. Also, most state-of-the-art RF receivers are not compatible with new waveforms used in emerging distributed sensing networks, new forms of the Global Positioning System (GPS), and new RF applications that are not served with existing narrow band antenna-based receivers. Many state-of-the-art RF receivers and sensors do not have the sensitivity required for these next generation RF applications.

Conventional RF devices that incorporate RF antennas have a high technology readiness level (TRL) and are used in almost every modern RF sensing or communications system. There are limitations with RF antennas, however, because they are Size, Weight and Power (SWaP) limited. The antenna is also on the order of the RF wavelength of radiation, and the RF coverage is over a relatively narrow frequency band, such as 1-10 GHz or 20-40 GHz. Many conventional RF receivers and antenna designs are not compatible with emerging waveforms and may lack sensitivity, making them difficult to cover wide bandwidths, such as 0-100 GHz with high sensitivity.

To address these limitations, Rydberg atom-based RF sensors have been developed, which convert the response of an atomic vapor to incoming RF radiation into measurable changes in an optical probe. These RF sensors provide a new model for RF sensing with increased sensitivity. For example, conventional antennas may provide at most about −130 to −160 dBi (decibels relative to an isotropic radiator), but with Rydberg system sensitivity, it can be up to about 170-180 dBi with a broader range coverage in a single receiver from KHz to THz.

In a Rydberg atom-based RF sensor, the measurement is based upon the attenuation of a probe laser due to absorption in a small room temperature vapor cell filled with alkali atoms, such as rubidium (Rb) or cesium (Cs). Atoms are simultaneously excited into a "Rydberg" state with both a coupling and probe. These Rydberg states are very responsive to local electric fields and the response of the atom to an external electric field, such as an RF signal, alters the measured attenuation of the probe laser and is detected by a probe laser photo detector. The magnitude of the electric field component of the incoming RF radiation may be determined by measuring the spectral splitting of two features in the probe laser absorption spectrum. This may be from Electromagnetically Induced Transparency (EIT) and Autler-Townes (AT) splitting.

Current Rydberg atom-based sensors may have low sampling rates that are set by the slow response time of the atomic system. Current Rydberg atom-based sensors also may be limited by their latency, due to the need for scanning the probe laser across the atomic absorption feature.

SUMMARY OF THE INVENTION

In general, a sensor receiver may include a Rydberg cell configured to be exposed to a radio frequency (RF) signal. A probe source may be configured to generate a plurality of spaced apart pulsed probe beams within the Rydberg cell, with the pulsed probe beams being offset in time from one another. A detector may be positioned downstream from the Rydberg cell. The probe source may be configured to generate the plurality of spaced apart pulsed probe beams without scanning. The probe source may comprise an optical source, and a pulse shaper downstream from the optical source. The probe source may comprise a beam splitter downstream from the pulse shaper, and a respective optical delay element in a path of each beam downstream from the beam splitter. Each optical delay element may comprise a respective different length of optical fiber.

A first microlens may be adjacent a first side of the Rydberg cell, and a second microlens may be adjacent a second side of the Rydberg cell. An excitation source may be coupled to the Rydberg cell. The excitation source may comprise an excitation laser and at least one mirror downstream therefrom. The excitation source may comprise a tunable excitation source. A controller may be coupled to the Rydberg cell, probe source, and detector.

Another aspect is directed to a method of receiving a radio frequency (RF) signal that may comprise exposing a Rydberg cell to the RF signal; operating a probe source to generate a plurality of spaced apart pulsed probe beams within the Rydberg cell, wherein the pulsed probe beams are offset in time from one another; and operating a detector downstream from the Rydberg cell.

BRIEF DESCRIPTION OF THE DRAWINGS

Other objects, features and advantages of the present invention will become apparent from the detailed description of the invention which follows, when considered in light of the accompanying drawings in which.

DETAILED DESCRIPTION

The present description is made with reference to the accompanying drawings, in which exemplary embodiments are shown. However, many different embodiments may be used, and thus, the description should not be construed as limited to the particular embodiments set forth herein. Rather, these embodiments are provided so that this disclosure will be thorough and complete. Like numbers refer to like elements throughout.

Figure 1:
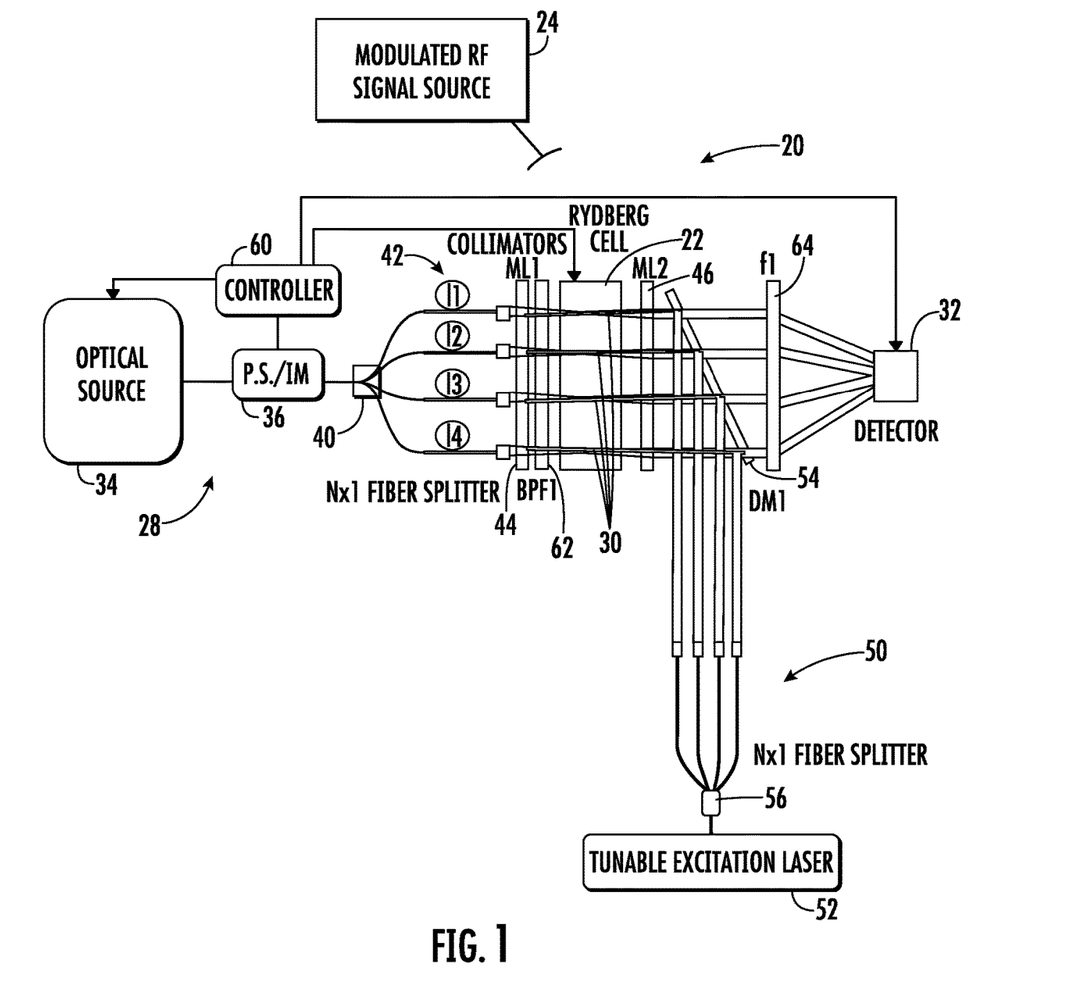
FIG. 1 is a schematic block diagram of the sensor receiver according to the invention.

Referring initially to FIG. 1, a sensor receiver is illustrated generally at 20 and includes a Rydberg cell 22 that is configured to be exposed to a radio frequency (RF) signal generated from a modulated RF signal source 24. This RF signal source 24 may include a non-modulated RF local oscillator. A probe source indicated generally at 28 is configured to generate a plurality of spaced apart pulsed probe beams within the Rydberg cell 22 and generally shown at 30, with the pulsed probe beams being offset in time from one another. It should be understood that one or more Rydberg cells may be used with the probe beams in multiple Rydberg cells. A detector 32 is positioned downstream from the Rydberg cell 22. In an example, the detector 32 is formed from a photodetector cell. The probe source 28 is configured to generate the plurality of spaced apart pulsed probe beams 30 in an example without scanning and may be formed as an optical source 34 and a pulse shaper 36 that is downstream from the optical source. The sensor receiver 20 may work with and without scanning the probe beam. The pulse shaper 36 may be an intensity modulator.

In an example, the probe source 28 includes a beam splitter 40, such as a N×1 fiber splitter, downstream from the pulse shaper 36 and a respective optical delay element 42 in a path of each beam downstream from the beam splitter. In a non-limiting example, each optical delay element 42 may be formed as a respective different length of optical fiber shown by the loops indicated as L1, L2, L3 and L4. Other delay mechanisms may be used besides fixed pulse delays, such as a changed optical fiber length, such as free space delay elements that may provide more temperature stability and delay tunability. In another non-limiting example, a first microlens 44 is positioned adjacent a first side of the Rydberg cell 22 and a second microlens 46 is positioned adjacent a second side of the Rydberg cell as illustrated by the designations ML1 and ML2.

An excitation source 50 as a coupling laser is coupled to the Rydberg cell 22 and formed, in an example, as a tunable excitation laser 52 and at least one mirror 54, such as a dichroic mirror downstream therefrom to input the output of the excitation laser and excite the rubidium or cesium used within the Rydberg cell 22. For a 4-beam version, as shown in FIG. 1, the N×1 fiber splitter 56 is a 4×1 splitter and may split the output into four beams from the excitation laser 50 corresponding to the illustrated four probe beams 30. A controller 60 is coupled to the Rydberg cell 22, the optical source 34 as the laser probe of the probe source 28 and detector 32.

As illustrated, a bandpass filter (BPF1) 62 may be included to block the excitation laser 52 and pass the spaced apart probe beams 30. A plano convex lens (f1) 64 may focus the probe beams 30 to the detector 32. The first microlens 44 and bandpass filter 62 may be formed as a collimator device, e.g., a Thorlabs part no. 50-780, and have a collimator output with about a 0.5 mm spot size beam at 780 nanometers as generated from the optical source 34 as a laser.

In an example, the Rydberg cell 22 is a rubidium Rydberg cell, such as Thorlabs part no. GC19075-RB. Other vapors of specific atomic elements may include Cesium (Cs), Potassium (K), Sodium (Na), and possibly Iodine (I). The sensor receiver 20 as illustrated will temporally and spectrally shape the signature of the pulsed probe beams 30, and thus, allows an increase in the sampling rate as proportional to the number of beams "N." Increasing the sampling rate is also dependent on the probe repetition rate. Separating the probe source 28 as a probe laser beam into N distinct pulses, each of which interrogates a distinct volume of the Rydberg cell 22, will increase the sampling of an incoming RF field in proportion to the number of beams "N." In addition to increasing the sampling rate, the bandwidth of the probe pulses may also help reduce the latency usually incurred by scanning the probe beam across the EIT spectrum. This may reduce the latency from about 1 to 2 orders of magnitude. The temporal pulse width of the probe determines its spectral bandwidth through a Fourier transform.

Figure 2:
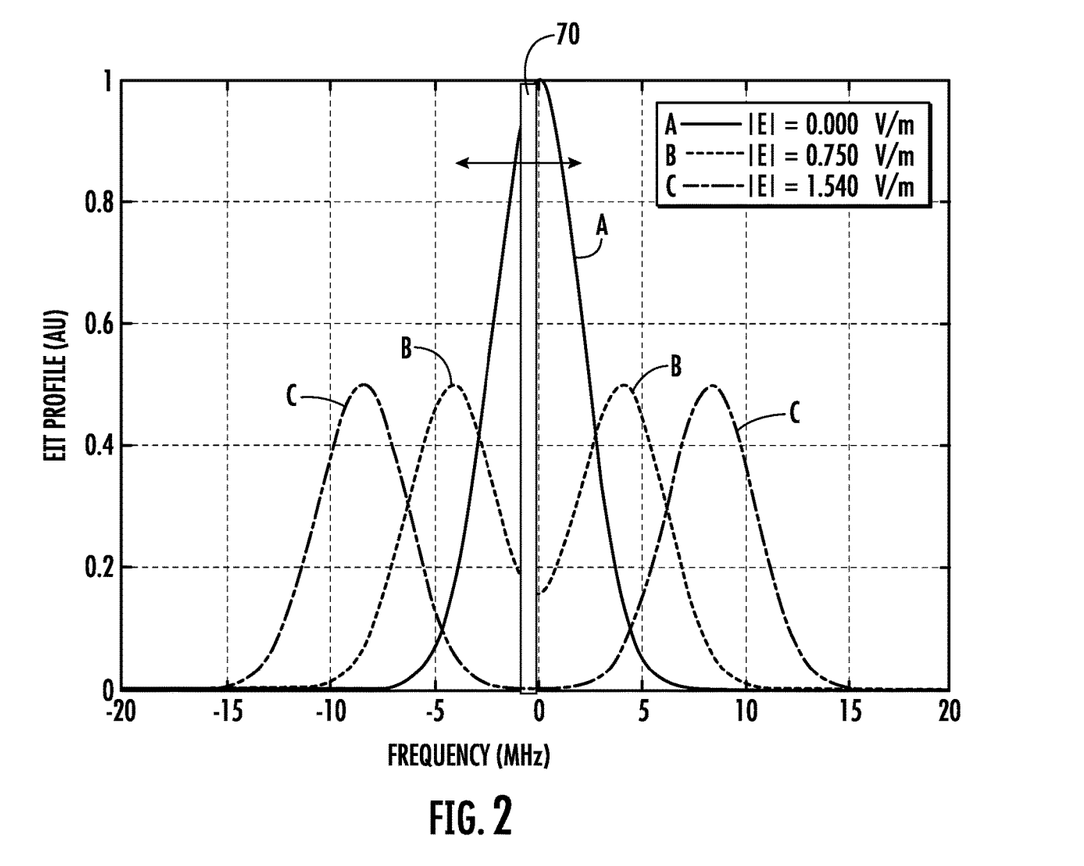
FIG. 2 is a graph showing a comparison between state-of-the-art sweeping of narrow band Rydberg sensor probes and the broadband response for the sensor receiver of FIG. 1.

It is possible to increase the probe bandwidth generated from the optical source 34 from about 100 KHz to about 200 MHz by choosing an appropriate pulse width. The incoming RF field may be mapped onto a spectroscopic fingerprint without scanning. For example, the graph in FIG. 2 shows a large vertical line 70 at 0 MHz frequency corresponding to the large EIT (Electromagnetically Induced Transparency) profile, which is indicative of how a state-of-the-art Rydberg sensor requires scanning of the narrow band probes. The sensor receiver 20 of FIG. 1, however, captures a response directly correlated to the integrated line absorption spectrum, i.e., the equivalent width for the case of the spectral character of the source propagating through the atomic vapor at/near the frequency of an atomic absorption line modified by the pressure of EIT and shown by the range of frequencies labeled A-C and indicative of the 0.0 (A) to 0.750 (B) and 1.540 V/m (C).

Figure 3A:
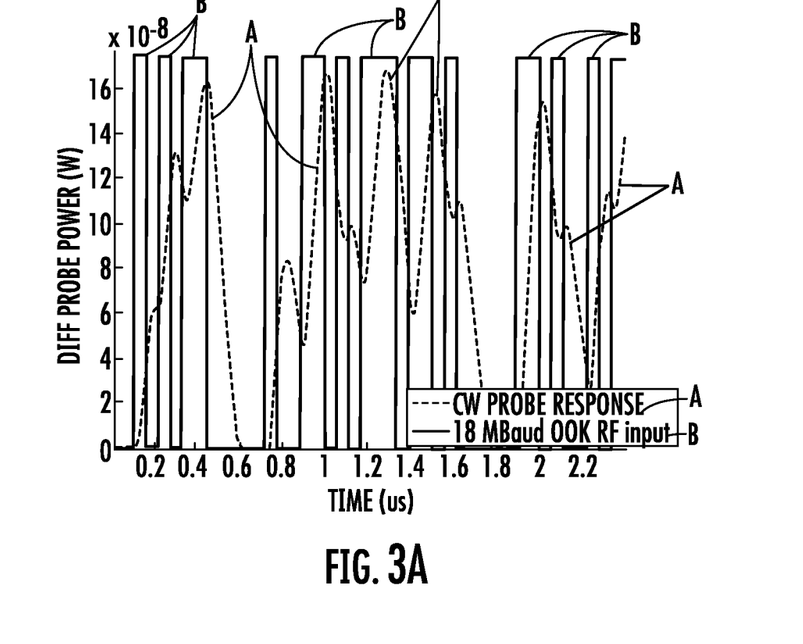
FIG. 3A is a graph showing the differential probe power versus time for a state-of-the-art Rydberg sensor.
Figure 3B:
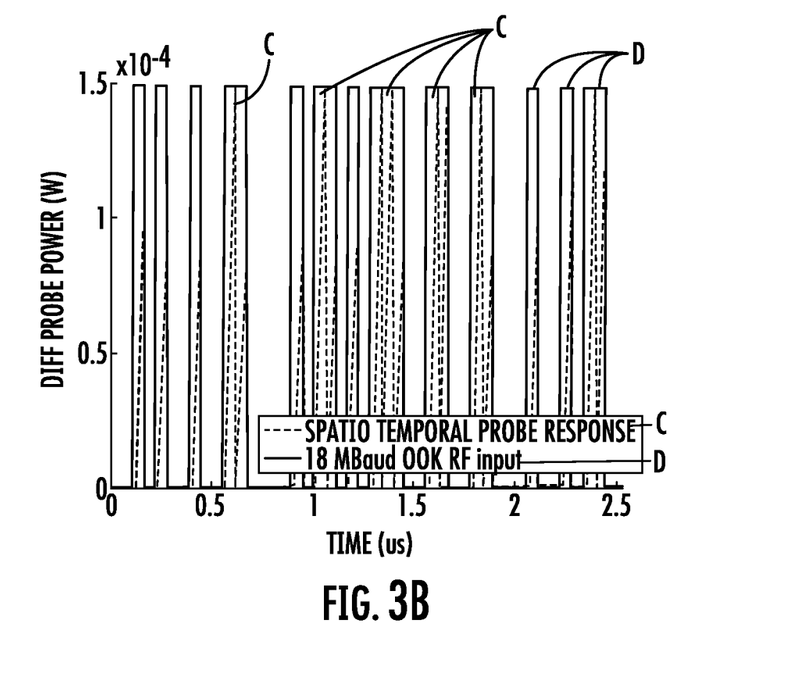
FIG. 3B is a graph similar to that shown in FIG. 3A, but for the sensor receiver of FIG. 1.

Referring now to FIGS. 3A and 3B, there are shown graphs where the state-of-the-art Rydberg sensor continuous wave probe signal shows that the atomic system cannot respond to changes in the external RF signal amplitude faster than its characteristic relaxation time. This is evident in waveforms such as that occurring in "on-off key" or OOK for sufficiently high data rates. This is shown in FIG. 3A, as compared to the sensor receiver 20 of FIG. 1 and where the graph in FIG. 3B shows the spatiotemporally multiplexed probe beam 30 that allows the atomic system to fully recover after it is probed. These two graphs in FIGS. 3A and 3B indicate that the sensor receiver 20 of FIG. 1 enables a higher signal-to-noise readout of higher-speed RF data streams. In these two examples, an 18 MBaud on off keyed (OOK) RF input was simulated.

As shown by the graph in FIG. 3A, corresponding to the state-of-the-art Rydberg sensor, as the RF data rate increases, the performance degrades and the SNR goes down due to the probe response being predominantly limited by preventing the atomic system to relay to equilibrium before the next RF amplitude increase, i.e., its data bit, arrives. On the other hand, as shown in the graph of FIG. 3B, corresponding to the sensor receiver 20 of FIG. 1, as the RF data rate increases, performance does not degrade and the SNR remains at a high value and does not lead to bit errors because the sensor receiver is being probed in its fully recovered state.

Figure 4:
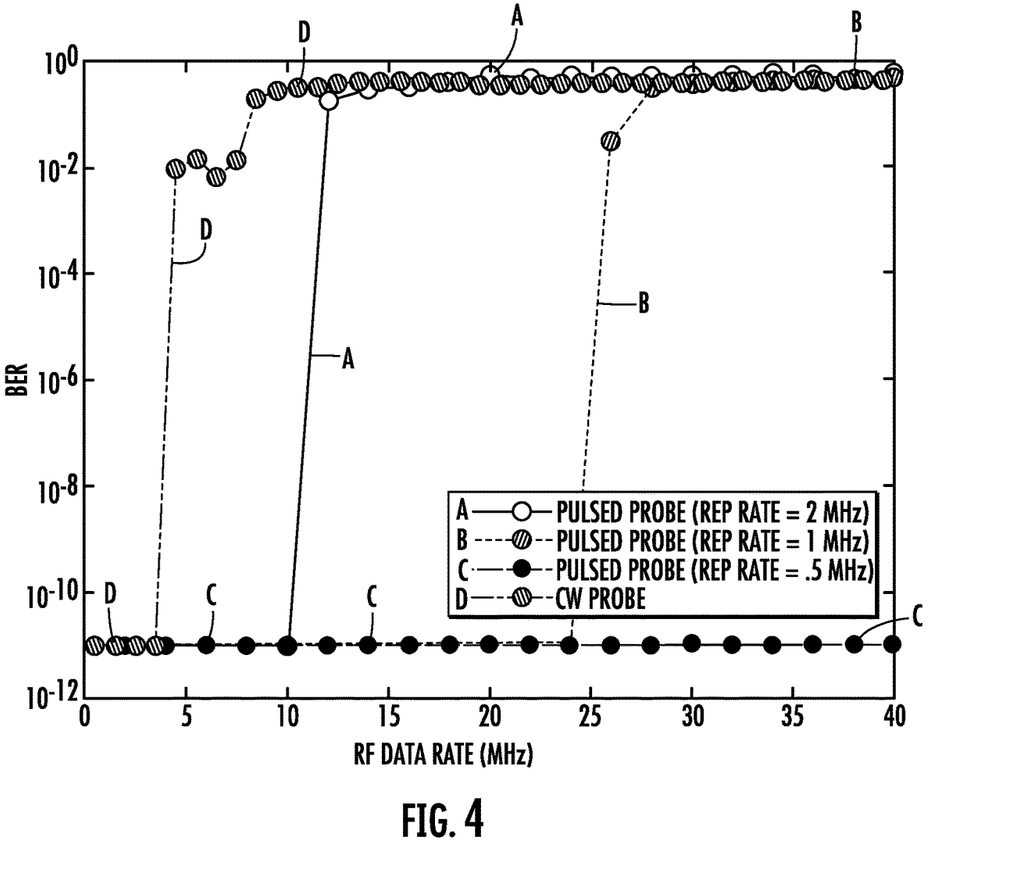
FIG. 4 is a graph comparing a state-of-the-art Rydberg sensor having a continuous wave probe with different pulsed probes of the sensor receiver of FIG. 1.

Referring now to FIG. 4, there is illustrated a graph that compares the bit error rate (BER) on the vertical axis of an RF OOK data stream with different rates for the state-of-the-art Rydberg atom-based sensor corresponding to the CW probe labeled by line D, and the sensor receiver 20 of FIG. 1, having different pulsed probes and a repetition rate of 2 MHz, 1 MHz, and 0.5 MHz shown by respective lines labeled A, B and C. The sensor receiver 20 of FIG. 1 can measure the RF data rates that are 15 times higher than possible with the state-of-the-art Rydberg sensors, for example, as from 3 MHz to 40+ MHz. The CW probe labeled by line D on the graph of FIG. 4 illustrates the state-of-the-art Rydberg sensor, while the pulsed probes labeled A, B and C are examples of the sensor receiver 20 of FIG. 1.

Figure 5A:
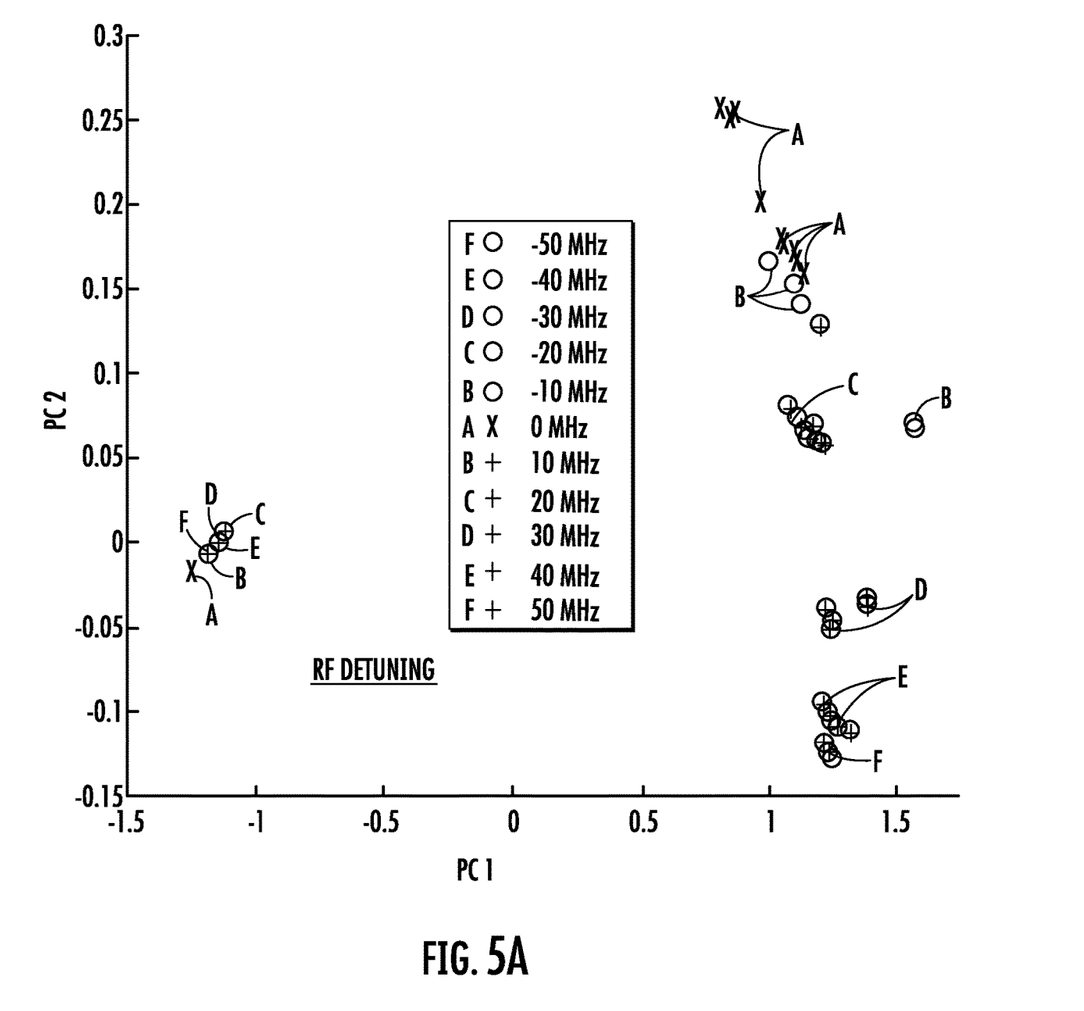
FIG. 5A is a graph showing principal component scores for a state-of-the-art Rydberg sensor.
Figure 5B:
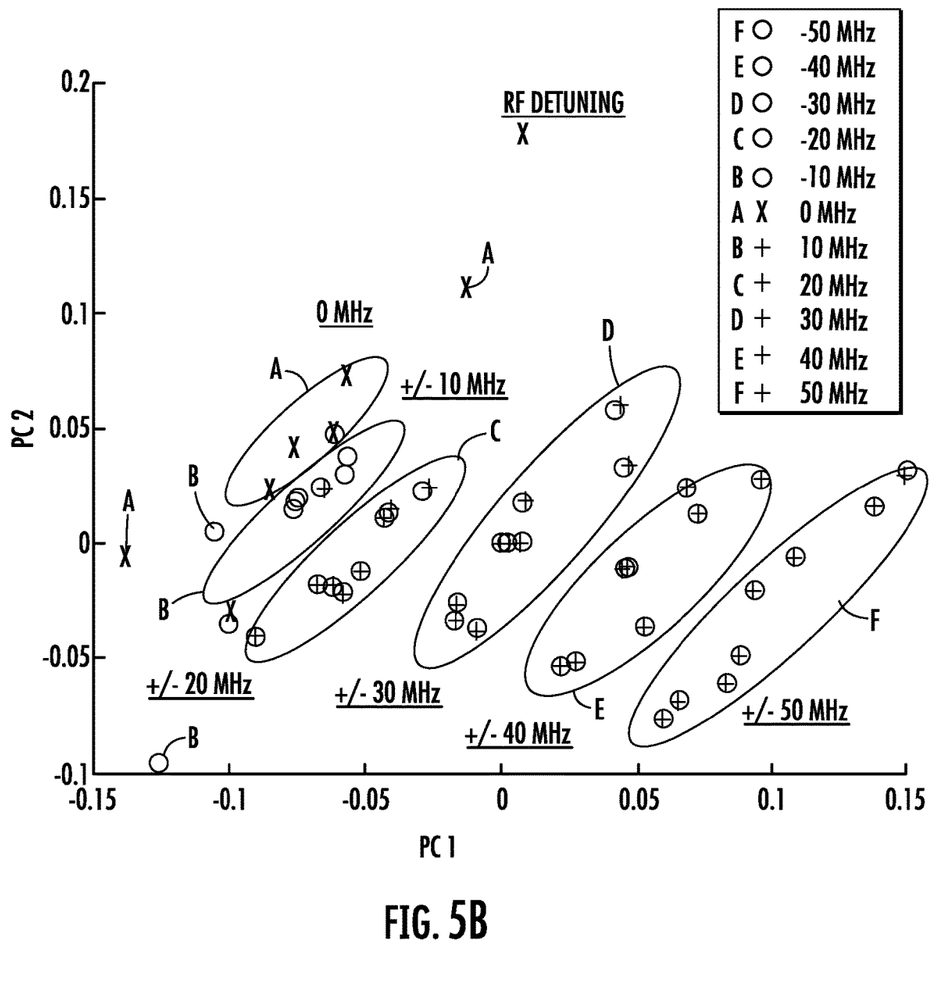
FIG. 5B is a graph showing the principal component scores for the sensor receiver of FIG. 1 showing that the data is separated based upon RF detuning.
Figure 5C:
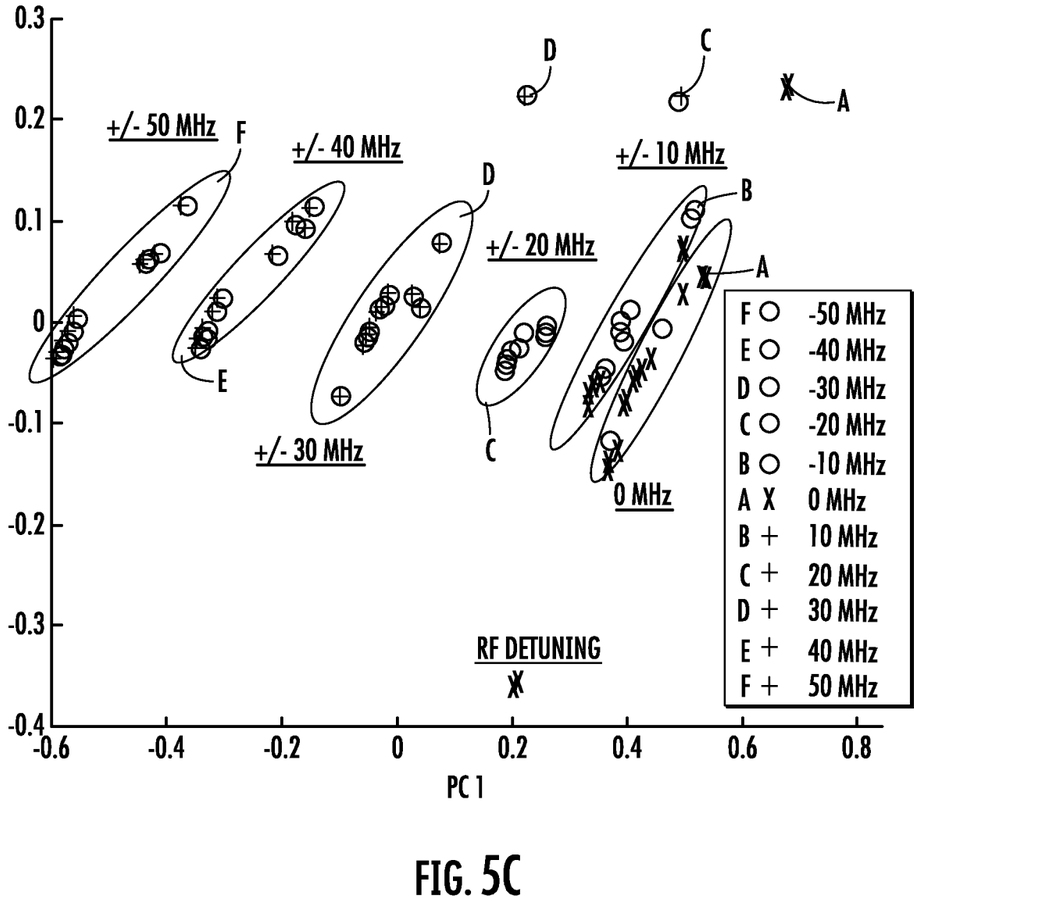
FIG. 5C is a graph showing the principal component scores for a sensor receiver of FIG. 1, but having a larger bandwidth than that sensor receiver of FIG. 5B.

Referring now to FIGS. 5A, 5B and 5C, there are illustrated graphs of how the sensor receiver 20 of FIG. 1 in the graphs of FIGS. 5B and 5C reduces latency and extracts the RF detuning of an incoming RF data stream without scanning the probe laser in comparison with the performance of a state-of-the-art Rydberg sensor as shown in FIG. 5A. FIG. 5B shows a graph of an example of the sensor receiver 20 of FIG. 1 with RF detuning without scanning, and in FIG. 5C with a larger bandwidth of the pulse probes.

As shown in FIG. 5A, based on the narrow spectrum of the continuous wave probe of a state-of-the-art Rydberg sensor, it may be difficult to extract reliable information about the RF detuning without scanning the probe beam from the laser. The two clusters of principal component (PC) scores for each RF detuning are illustrated on the left and the right in FIG. 5A. The left-hand side for the RF detuning at the different frequencies ranging from 0 MHz to +/−50 MHz is indistinguishable, while the right-hand side is more easily distinguishable. In the graph of FIG. 5B, on the other hand, it is evident that with the sensor receiver 20 having the pulsed probe architecture, the RF detuning data can be extracted without scanning the probe laser. The PC scores clearly separate the data based on the RF detuning as shown by the separated frequencies and labeled A-F.

In the graph of FIG. 5C, as the bandwidth of the pulsed probe increases when using the sensor receiver 20 of FIG. 1, there is greater ability to determine information about the RF detuning value. The PC scores between successive RF groups increases as the bandwidth of the probe increases as shown by the comparison of FIGS. 5B and 5C. The state-of-the-art Rydberg sensor as shown with its performance in FIG. 5A uses a probe laser as a continuous wave laser that spectrally scans the absorption feature. The sensor receiver 20 of FIG. 1, however, allows spatial-temporal multiplexing where multiple pulsed beams 30 may be in one Rydberg cell 22. Individual pulses of the probe laser are temporally separated and routed through unique spatial volumes of the Rydberg cell 22 and then recombined photonically prior to photo detection in the detector 32. The pulsed probe leverages the spectral content of the pulse to measure an output that can be correlated through post processing algorithms, to an RF detuning value while simultaneously measuring an incoming RF data stream. Pulsing the probe laser also increases the measurement rate of a single beam's absorption feature by replacing the slower spectral scanning techniques of the state-of-the-art Rydberg sensors.

Figure 6:
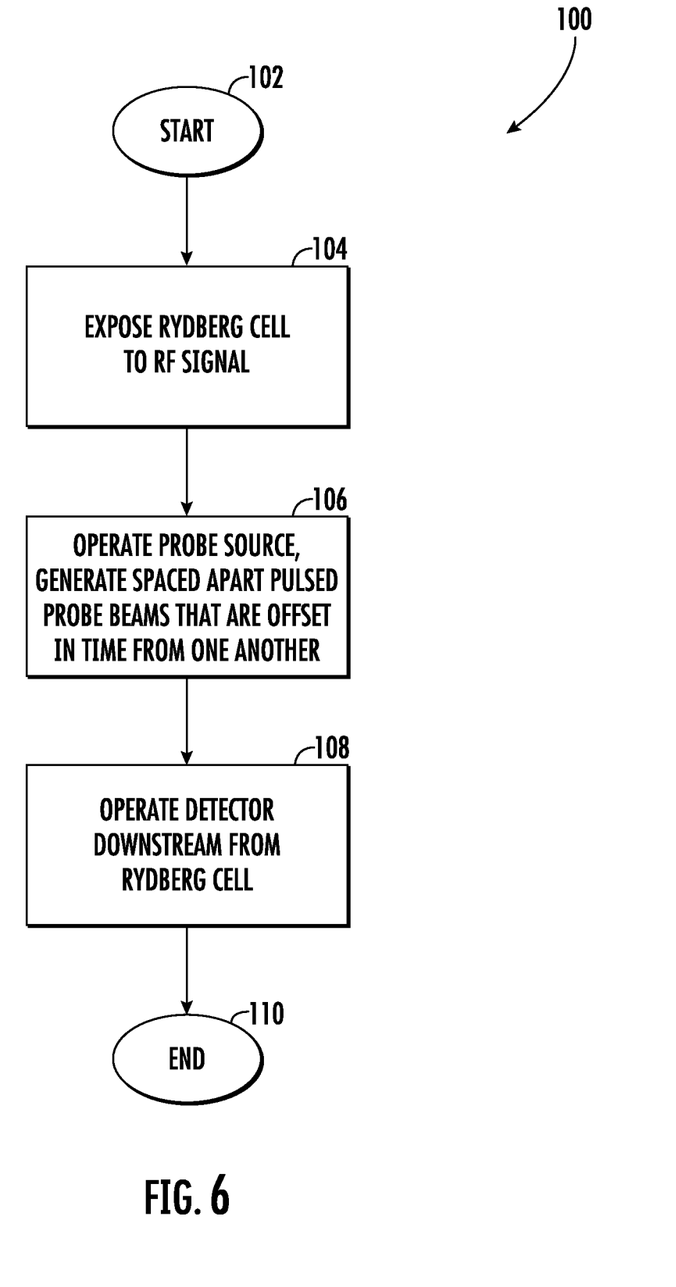
FIG. 6 is a high-level flowchart of a method for receiving an RF signal using the sensor receiver of FIG. 1.

Referring now to FIG. 6, there is illustrated generally at 100 a method for receiving an RF signal using the sensor receiver 20 of FIG. 1. The method starts (Block 102) and the Rydberg cell 22 is exposed to the RF signal (Block 104). The probe source 28 is operated to generate a plurality of spaced apart pulsed probe beams 30 within the Rydberg cell 22, with the pulsed probe beams being offset in time from each other (Block 106). The detector 32 is operated downstream from the Rydberg cell 22 (Block 108) and the process ends (Block 110).

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

The invention claimed is:

1. A sensor receiver comprising:
   a Rydberg cell configured to be exposed to a radio frequency (RF) signal;
   a probe source configured to generate a plurality of spaced apart pulsed probe beams within the Rydberg cell, with the pulsed probe beams being offset in time from one another; and
   a detector downstream from the Rydberg cell.

2. The sensor receiver of claim 1, wherein the probe source is configured to generate the plurality of spaced apart pulsed probe beams without scanning.

3. The sensor receiver of claim 1, wherein the probe source comprises an optical source, and a pulse shaper downstream from the optical source.

4. The sensor receiver of claim 3, wherein the probe source comprises a beam splitter downstream from the pulse shaper, and a respective optical delay element in a path of each beam downstream from the beam splitter.

5. The sensor receiver of claim 4, wherein each optical delay element comprises a respective different length of optical fiber.

6. The sensor receiver of claim 1, comprising a first microlens adjacent a first side of the Rydberg cell, and a second microlens adjacent a second side of the Rydberg cell.

7. The sensor receiver of claim 1, comprising an excitation source coupled to the Rydberg cell.

8. The sensor receiver of claim 7, wherein the excitation source comprises an excitation laser and at least one mirror downstream therefrom.

9. The sensor receiver of claim 7, wherein the excitation source comprises a tunable excitation source.

10. The sensor receiver of claim 1, comprising a controller coupled to the Rydberg cell, probe source, and detector.

11. A sensor receiver comprising:
    a Rydberg cell configured to be exposed to a radio frequency (RF) signal;
    a probe source comprising an optical source, and a pulse shaper downstream therefrom and configured to generate a plurality of non-scanned, spaced apart, pulsed probe beams within the Rydberg cell, with the non-scanned, spaced apart, pulsed probe beams being offset in time from one another; and
    a detector downstream from the Rydberg cell.

12. The sensor receiver of claim 11, wherein the probe source comprises a beam splitter downstream from the pulse shaper, and a respective optical delay element in a path of each beam downstream from the beam splitter.

13. The sensor receiver of claim 12, wherein each optical delay element comprises a respective different length of optical fiber.

14. The sensor receiver of claim 11, comprising a first microlens adjacent a first side of the Rydberg cell, and a second microlens adjacent a second side of the Rydberg cell.

15. The sensor receiver of claim 11, comprising an excitation source coupled to the Rydberg cell.

16. The sensor receiver of claim 15, wherein the excitation source comprises an excitation laser and at least one mirror downstream therefrom.

17. The sensor receiver of claim 15, wherein the excitation source comprises a tunable excitation source.

18. The sensor receiver of claim 11, comprising a controller coupled to the Rydberg cell, probe source, and detector.

19. A method for receiving a radio frequency (RF) signal comprising:
   exposing a Rydberg cell to the RF signal;
   operating a probe source to generate a plurality of spaced apart pulsed probe beams within the Rydberg cell, with the pulsed probe beams being offset in time from one another; and
   operating a detector downstream from the Rydberg cell.

20. The method of claim 19, comprising generating the plurality of spaced apart pulsed probe beams without scanning.

21. The method of claim 19, wherein the probe source comprises an optical source, a pulse shaper downstream from the optical source, a beam splitter downstream from the pulse shaper, and a respective optical delay element in a path of each beam downstream from the beam splitter.

22. The method of claim 19, comprising operating an excitation source coupled to the Rydberg cell.

\* \* \* \* \*